(12) United States Patent
Qian et al.

(10) Patent No.: US 9,379,159 B2
(45) Date of Patent: Jun. 28, 2016

(54) METHOD OF FABRICATING MULTI-WAFER IMAGE SENSOR

(71) Applicant: OMNIVISION TECHNOLOGIES, INC., Santa Clara, CA (US)

(72) Inventors: Yin Qian, Milpitas, CA (US); Dyson H. Tai, San Jose, CA (US); Jin Li, San Jose, CA (US); Chen-Wei Lu, Zhubei (TW); Howard E. Rhodes, Nokomis, FL (US)

(73) Assignee: OmniVision Technologies, Inc., Santa Clara, CA (US)

(*) Notice: Subject to any disclaimer, the term of this patent is extended or adjusted under 35 U.S.C. 154(b) by 0 days.

(21) Appl. No.: 14/515,307

(22) Filed: Oct. 15, 2014

(65) Prior Publication Data

US 2016/0111468 A1 Apr. 21, 2016

(51) Int. Cl.
*H01L 27/14* (2006.01)
*H01L 27/146* (2006.01)

(52) U.S. Cl.
CPC .... *H01L 27/14687* (2013.01); *H01L 27/14636* (2013.01)

(58) Field of Classification Search
CPC ....................................................... H01L 21/00
USPC ................................. 438/244, 23, 24, 59, 106
See application file for complete search history.

(56) References Cited

U.S. PATENT DOCUMENTS

| 7,749,799 B2 | 7/2010 | Pain |
| 2007/0117254 A1* | 5/2007 | Pain ................. H01L 27/14621 438/75 |
| 2008/0017946 A1 | 1/2008 | Cazaux et al. |
| 2009/0146148 A1* | 6/2009 | Pyo ................... H01L 27/14632 257/59 |
| 2013/0126707 A1 | 5/2013 | Blanquart |

OTHER PUBLICATIONS

Yarema, R., "The Via Revolution," PowerPoint presentation, Vertex 2010, Loch Lomond, Scotland, Jun. 7-11, 2010 (26 pages).
De Moor, P., "3D integrated pixel sensors: A technology development enabling smart imaging systems," VIPS Apr. 22, 2010, IMEC 2010 (54 pages).

(Continued)

*Primary Examiner* — Chuong A Luu
*Assistant Examiner* — Rodolfo Fortich
(74) *Attorney, Agent, or Firm* — Blakely Sokoloff Taylor & Zafman LLP

(57) ABSTRACT

A method of fabricating an image sensor includes forming a pixel array in an imaging region of a semiconductor substrate and forming a trench in a peripheral region of the semiconductor substrate after forming the pixel array. The peripheral region is on a perimeter of the imaging region. The trench is filled with an insulating material. An interconnect layer is formed after filling the trench with insulating material. A first wafer is bonded to a second wafer. The first wafer includes the interconnect layer and the semiconductor substrate. A backside of the semiconductor substrate is thinned to expose the insulating material. A via cavity is formed through the insulating material. The via cavity extends down to a second interconnect layer of the second wafer. The via cavity is filled with a conductive material to form a via. The insulating material insulates the conductive material from the semiconductor substrate.

9 Claims, 17 Drawing Sheets

(56) References Cited

OTHER PUBLICATIONS

Motoyoshi, M. et al., "3D-LSI technology for image sensor," Pixel 2008 International Workshop, Sep. 23-26, 2008, Batavia, Illinois, IOP Publishing Ltd and SISSA, Mar. 16, 2009 (14 pages).

Milojevic, D. et al., "Thermal Characterization of Cloud Workloads on a Power-Efficient Server-on-Chip," 2012 IEEE $30^{th}$ International Conference on Computer Design (ICCD), Sep. 30-Oct. 3 2012, Montreal, Canada, 2012 IEEE, pp. 175-182.

* cited by examiner

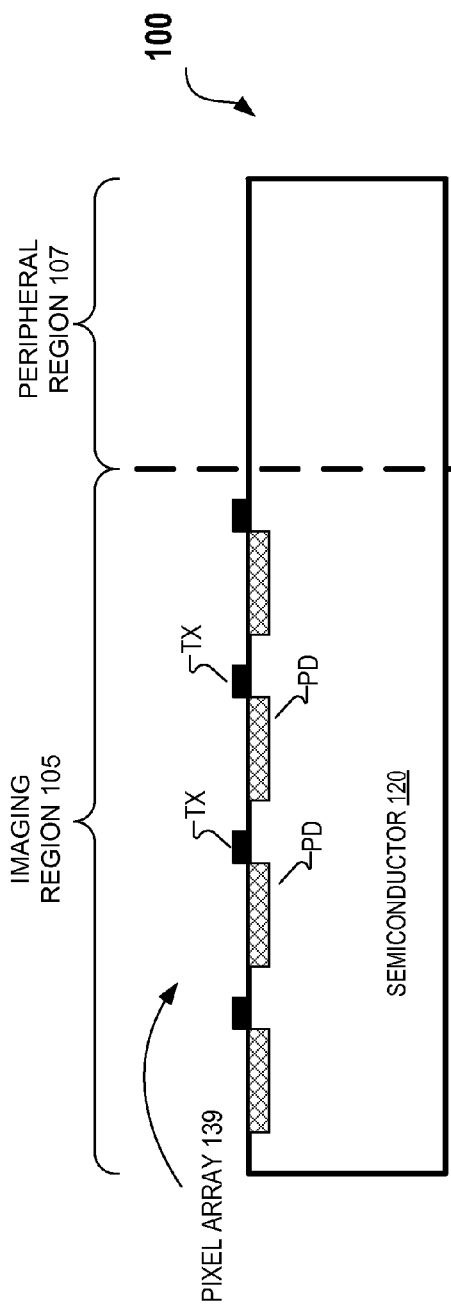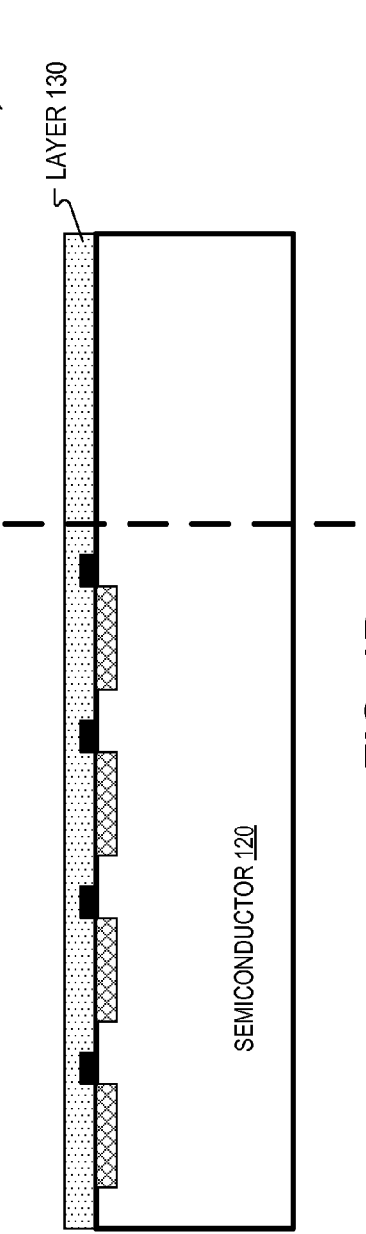

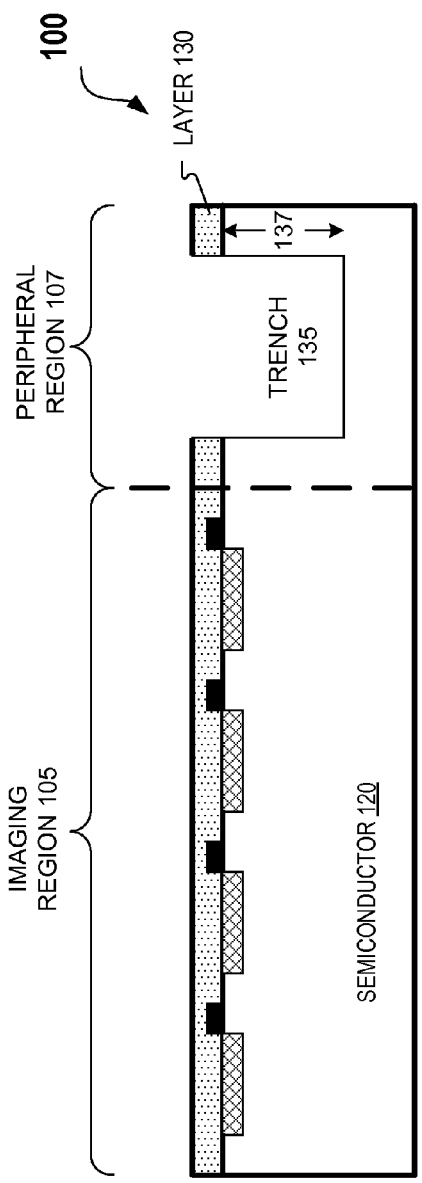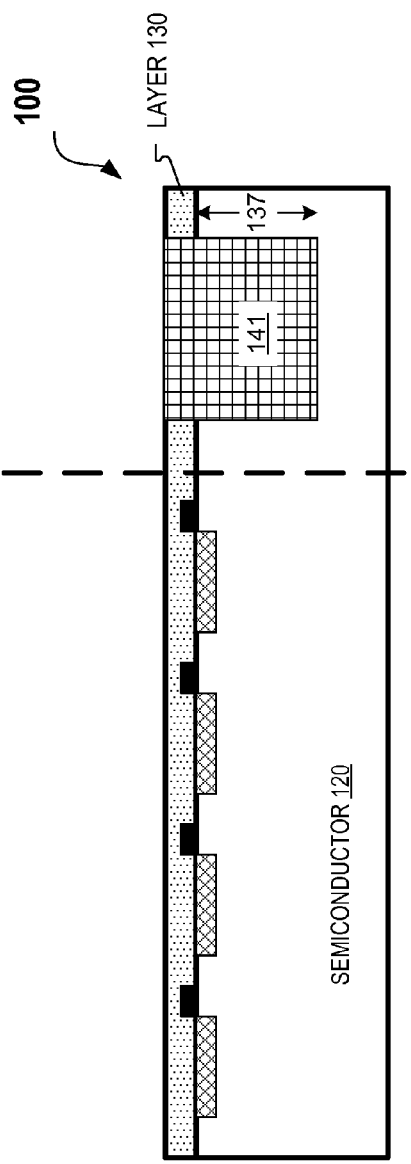

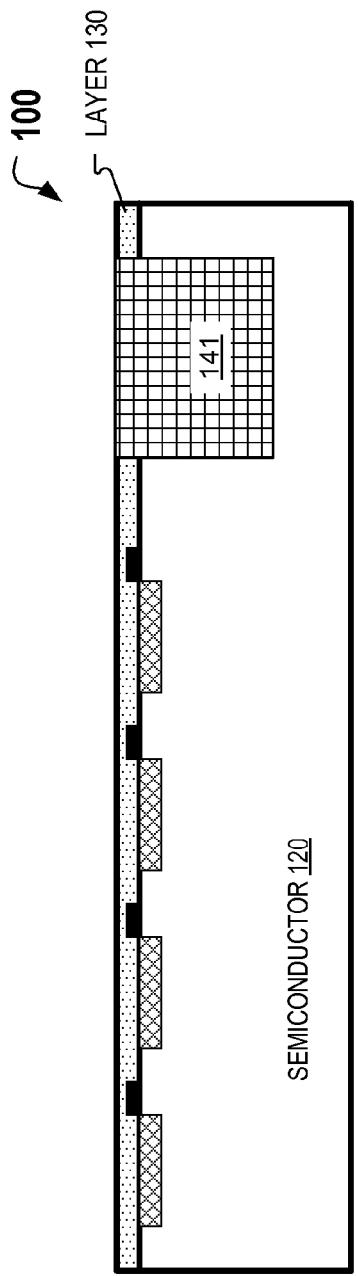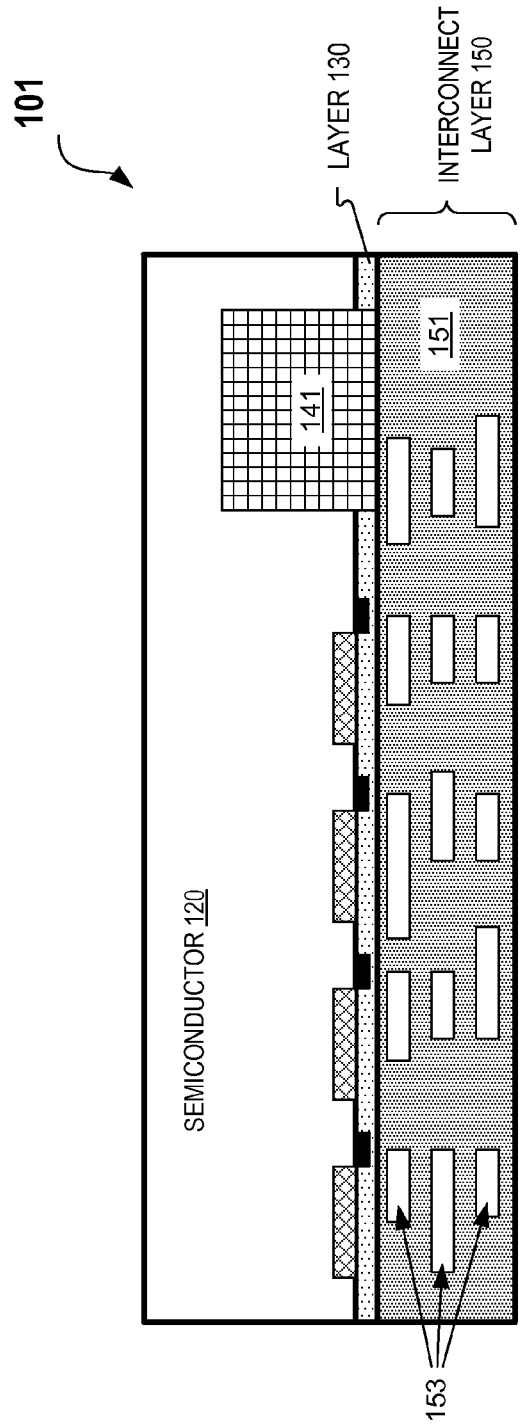

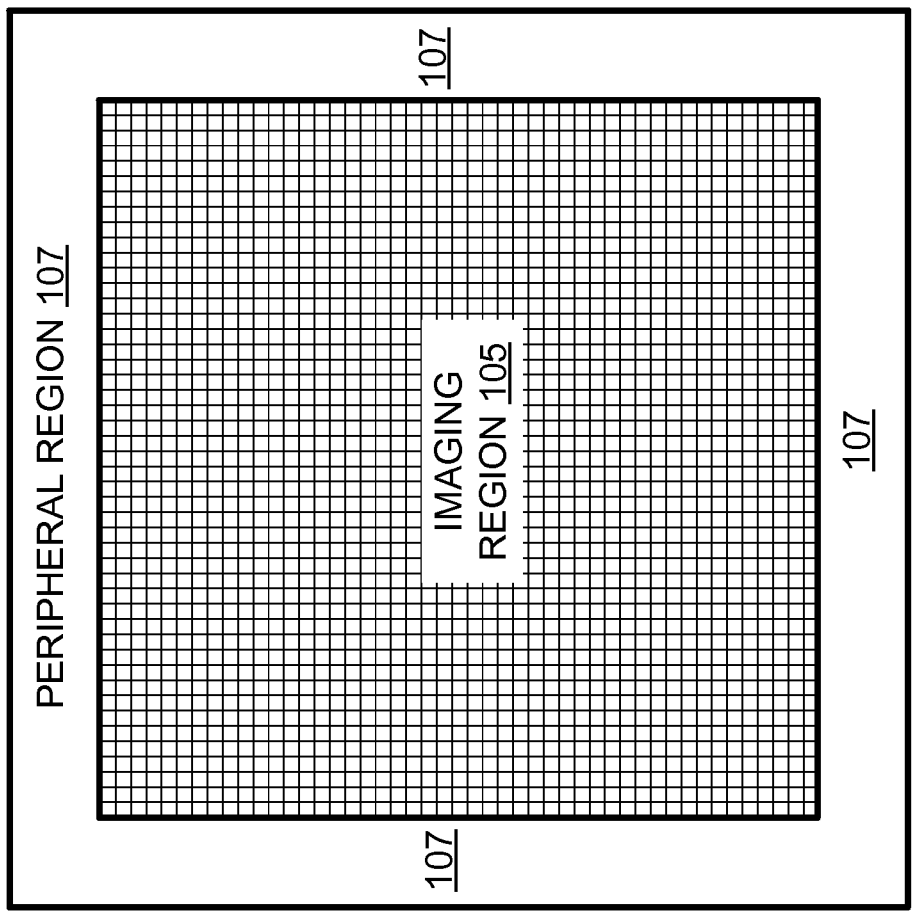

METHOD OF FABRICATING MULTI-WAFER IMAGE SENSOR

TECHNICAL FIELD

This disclosure relates generally to fabricating image sensors, and in particular but not exclusively, relates to Backside Illuminated image sensors.

BACKGROUND INFORMATION

Demand for image sensors has increased as both consumer and commercial products utilize image sensors in an increased range of devices. Buyers desire image sensors with faster performance and higher quality imaging capabilities. To produce image sensors that meet these demands, multi-wafer image sensors have been developed.

Conventional processes to connect one wafer of an image sensor to another include forming a trench/cavity in silicon, lining the trench/cavity with an insulator, and filling the lined trench with copper. However, forming the trench in silicon requires patterning that reduces process margin and limits design rules. Additionally, lining the trench with an insulator fills the trench with material that reduces the area available for a conductive material for electrical connection. This increases the amount of real estate required for each electrical connection between wafers and may also increase the number of vias required to carry certain electrical signals. Therefore, a method of fabricating a multi-wafer image sensor that increased connectivity density between wafers and reduced onerous process steps would be desirable.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIGS. 1A-1K illustrate a process for fabricating a multi-wafer image sensor by forming one or more vias between a first wafer and a second wafer, in accordance with an embodiment of the disclosure.

FIG. 2 shows a plan view of an image sensor that includes a peripheral region on a perimeter of an imaging region of the image sensor, in accordance with an embodiment of the disclosure.

DETAILED DESCRIPTION

Figure 1G:
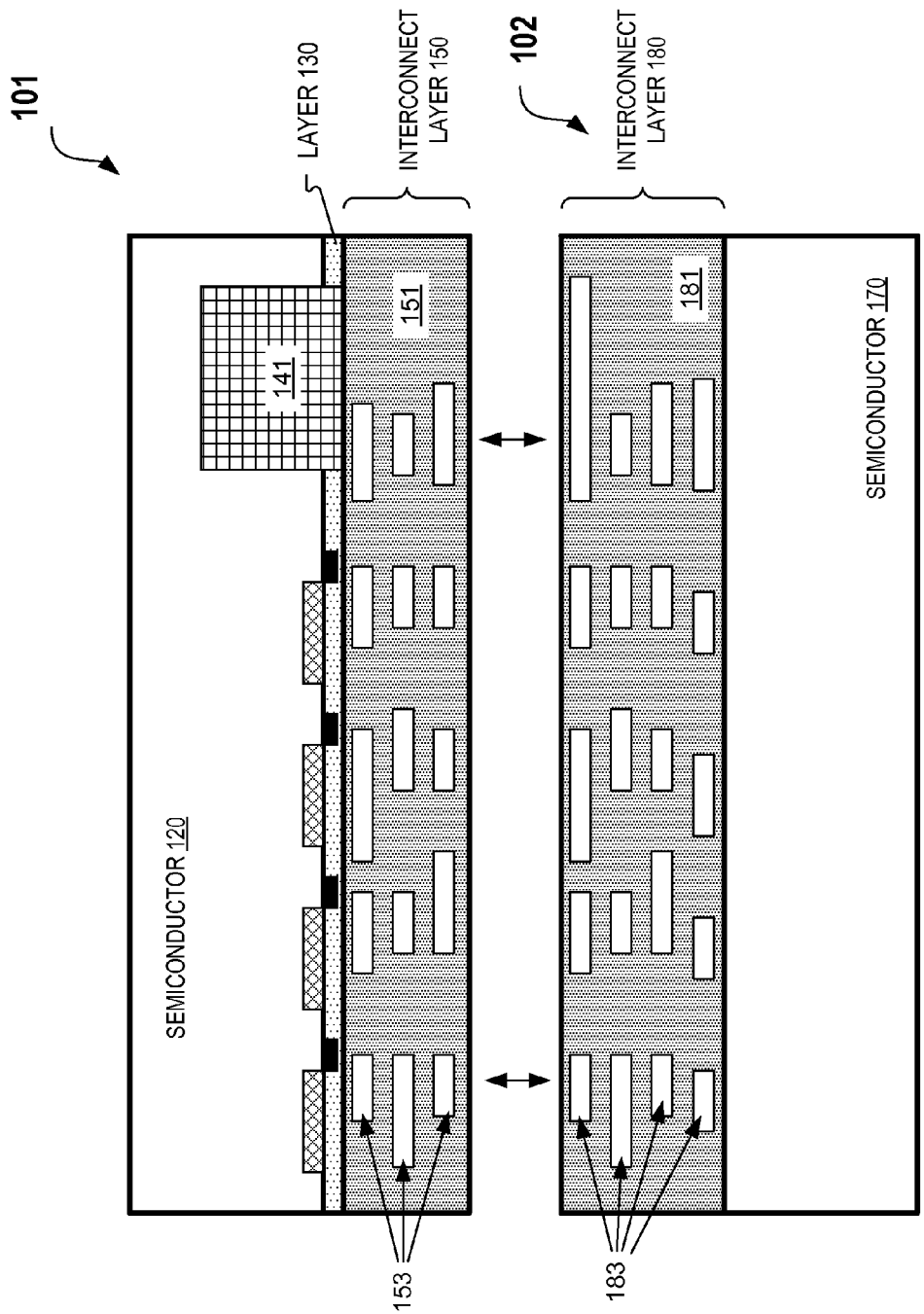

Embodiments of a multi-wafer image sensor and a method of fabricating a multi-wafer image sensor are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

FIGS. 1A-1K illustrate a process for fabricating a multi-wafer image sensor by forming one or more vias between a first wafer and a second wafer, in accordance with an embodiment of the disclosure.

FIG. 1A shows a wafer structure 100 where a pixel array 139 is formed in an imaging region 105 of semiconductor substrate 120. In one embodiment, semiconductor substrate 120 includes silicon. In the illustrated embodiment, the pixel array includes photodiodes ("PD") and transfer gates ("TX") coupled to transfer image charge generated by the photodiodes into a floating diffusion region (not illustrated). Each pixel in the pixel array may have additional transistors for transferring the image charge from the floating diffusions to a readout column for read out at the appropriate time. The photodiodes may be doped opposite (e.g. N doped) from the semiconductor substrate 120 (e.g. P doped), as is known in the art.

In FIG. 1B, a layer 130 is formed over peripheral region 107 and over imaging region 105. Layer 130 may be an insulator to electrically insulate the transfer gates TX. In one embodiment, layer 130 is silicon dioxide.

FIG. 2 shows a plan view of an image sensor that includes peripheral region 107 on a perimeter of an imaging region 105 of the image sensor, in accordance with an embodiment of the disclosure. In the illustrated embodiment, peripheral region 107 fully surrounds imaging region 105, but in different embodiments, peripheral region 107 may not fully surround imaging region 105. For the purposes of this disclosure, peripheral region 107 includes the region on the outside of a pixel array of imaging region 105, as viewed in FIG. 2. Peripheral region 107 does not include inter-pixel regions between pixels in a pixel array (e.g. pixel array 139) disposed in imaging region 105. The pixel array disposed in imaging region 105 may be arranged in rows and columns. The pixel array receives image light that is propagating into the page, in FIG. 2.

In FIG. 1C, a trench 135 is formed in peripheral region 107. Trench 135 may be formed by an etching process that etches through layer 130 and semiconductor substrate 120. In one embodiment, the etchant is a plasma of fluorinated sulfide and semiconductor substrate 120 is silicon. Trench 135 has a trench depth of 137. Trench 135 has a trench depth 137 that is deeper than the photodiodes of the pixel array 139 that is disposed in imaging region 105. In one embodiment, trench depth 137 is 2-3 µm.

In FIG. 1D, trench 135 is filled with an insulating material 141. Insulating material 141 may include an oxide similar to oxides used in shallow-trench-isolation ("STI"). Insulating material 141 may be spun on. Insulating material 141 may be silicon oxide and be disposed in a Chemical-Vapor-Deposition ("CVD") process. Insulating material 141 should be selected to have a temperature coefficient of expansion that is similar to semiconductor substrate 120.

FIG. 1E shows insulating material 141 after it is planarized. A Chemical-Mechanical-Polishing ("CMP") process may be employed to planarized insulating material 141. When trench 135 is filled with insulating material 141 in FIG. 1D, excess insulating material 141 may be left on wafer structure 100 and be removed during the planarizing of insulating material 141 in FIG. 1E. A portion of layer 130 may also be removed during the planarization of insulating material 141, although a portion of layer 130 must be left over the transfer gates, as shown.

In FIG. 1F, an interconnect layer 150 is formed. Interconnect layer 150 spans imaging region 105 and peripheral region 107. Interconnect layer 150 includes metal interconnect layers 153 and interconnect dielectrics 151 to insulate the metal interconnect layers 153. In the illustrated embodiment, there are three layers of metal interconnects. However, in other embodiments, there may be a greater or fewer number of metal interconnect layers. In the illustrated embodiment, interconnect layer 150 is formed on layer 130. Wafer 101 includes semiconductor substrate 120 and interconnect layer 150.

In FIG. 1G, first wafer 101 is bonded to a second wafer 102. Second wafer 102 includes semiconductor substrate 170 and interconnect layer 180. Semiconductor substrate 170 may have the same properties as semiconductor substrate 120. Second wafer 102 may include processing circuitry (e.g. readout circuitry 410, function logic 415, and control circuitry 420 discussed in FIG. 4 below) for processing image data from pixel array 139. The processing circuitry is disposed in semiconductor substrate 170. In the illustrated embodiment, interconnect layer 150 is bonded to interconnect layer 180 such that interconnect layer 150 and interconnect layer 180 are disposed between semiconductor substrates 120 and 170. The interconnect layers may have micro solder bumps, which may be arranged in a grid pattern. The solder bumps on the outsides of the interconnect layers may be soldered together so that the signals can be exchanged between the interconnect layers. Interconnect layer 180 includes metal interconnect layers 183 and interconnect dielectrics 181 to insulate metal interconnect layers 183. In the illustrated embodiment of FIG. 1G, there are four layers of metal interconnects. However, in other embodiments, there may be a greater or fewer number of metal interconnects layers.

Figure 1H:
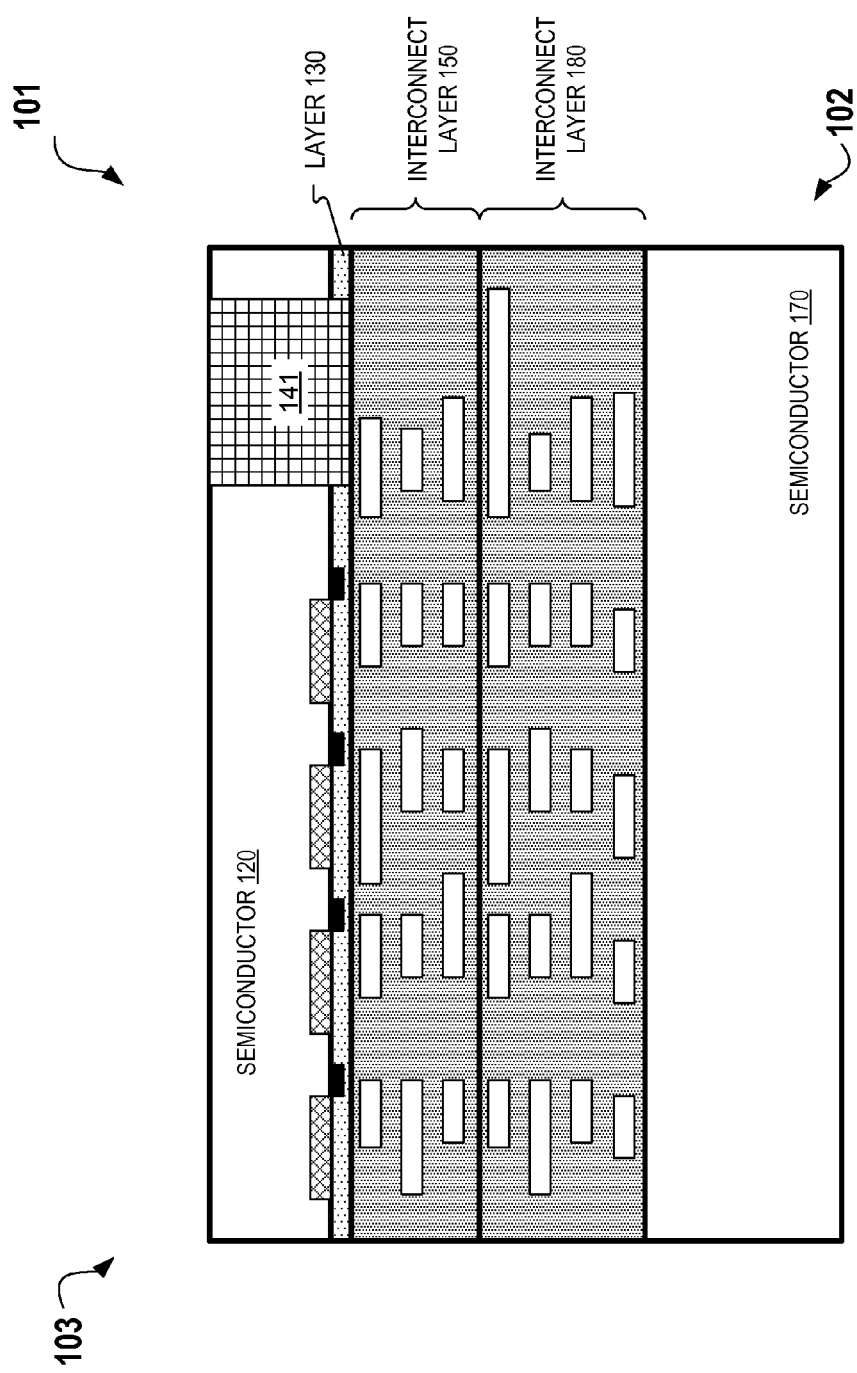

FIG. 1H shows multi-wafer image sensor 103 after wafer 101 is bonded to wafer 102. Additionally, a backside of semiconductor substrate 120 is thinned to expose insulating material 141. Thinning the backside of semiconductor substrate 120 also serves to reduce the semiconductor material between the photodiodes of pixel array 139 and the incoming image light making pixel array 139 a Backside Illuminated pixel array.

Figure 1I:
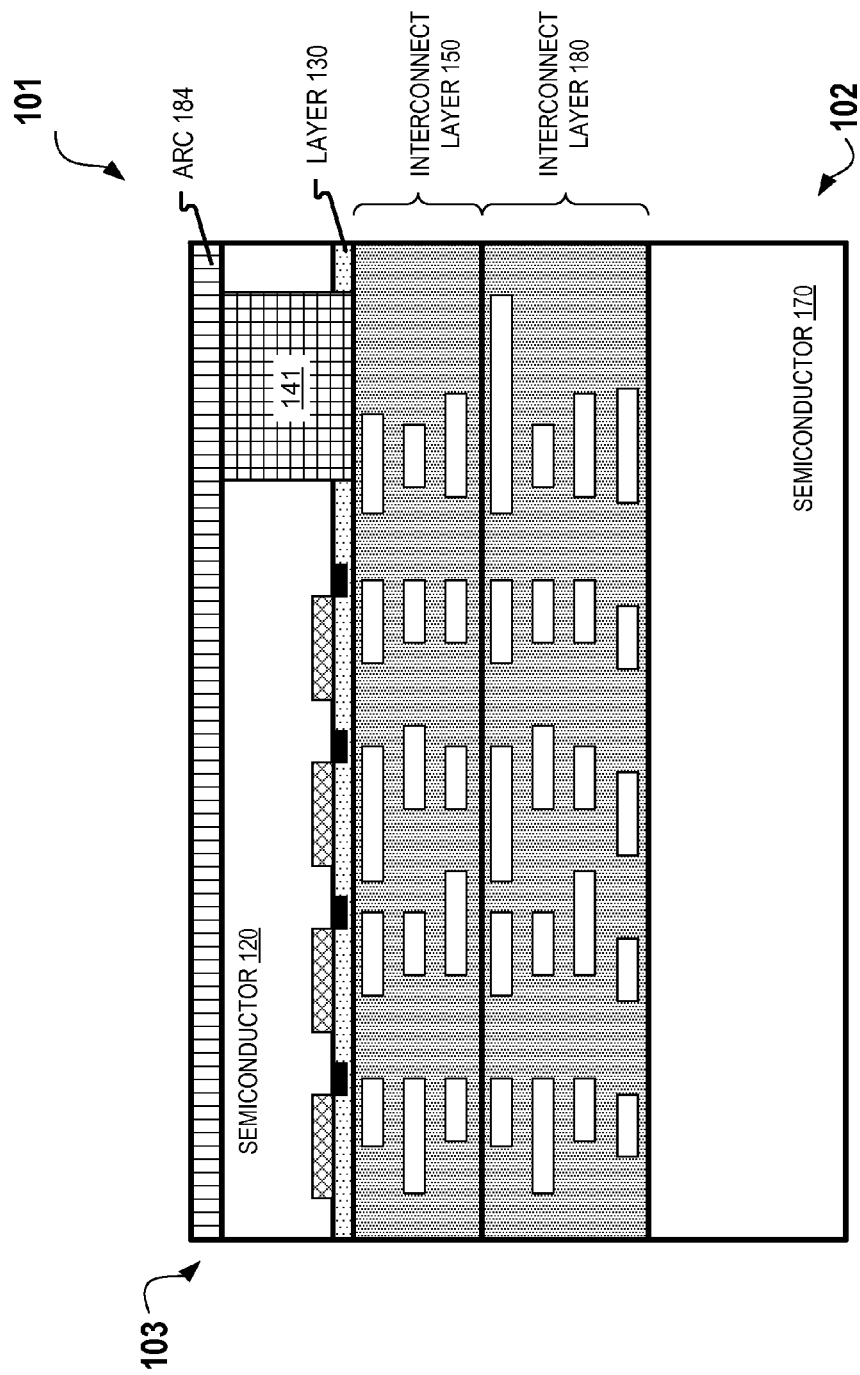

In FIG. 1I, Anti-Reflective Coating ("ARC") 184 is formed. ARC layer 184 may have electrical insulation properties. In one embodiment, ARC layer 184 is a silicon oxide covered with silicon nitride. Other electrically insulating layers (not shown) may be formed in place of or in addition to ARC layer 184.

Figure 1J:
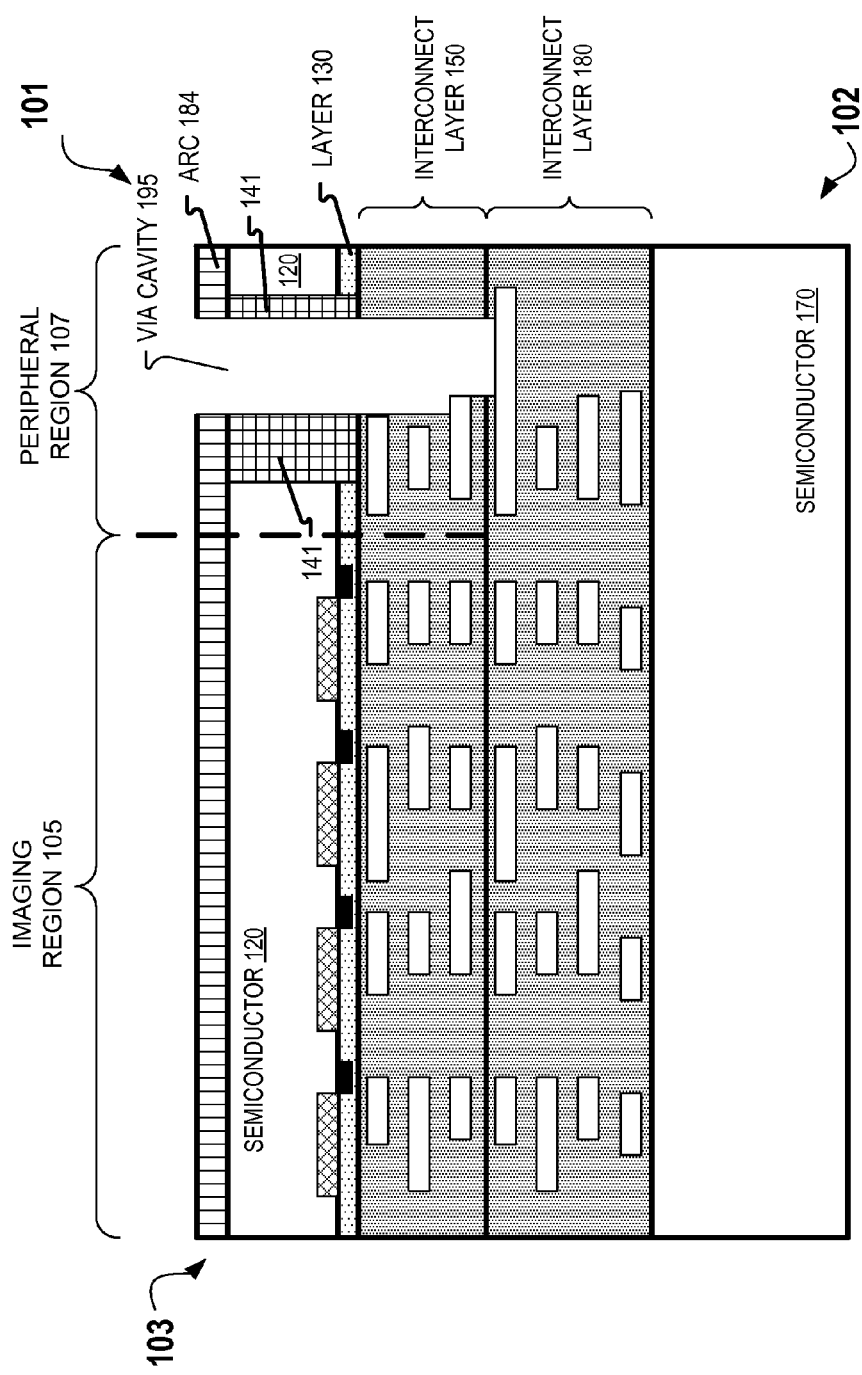

In FIG. 1J, a via cavity 195 is formed through insulating material 141 and ARC layer 184. Via cavity 195 extends down to second interconnect layer 180. In FIG. 1J, via cavity 195 extends down to a metal interconnect layer 183 disposed in dielectric layer 181 of second interconnect layer 180. Via cavity 195 may be formed by a patterned etch with etchants that are chemically configured to etch ARC 184, insulating material 141, and dielectrics 151 and 181. However, the etchants may not etch metal layers 153 and 183.

Figure 1K:
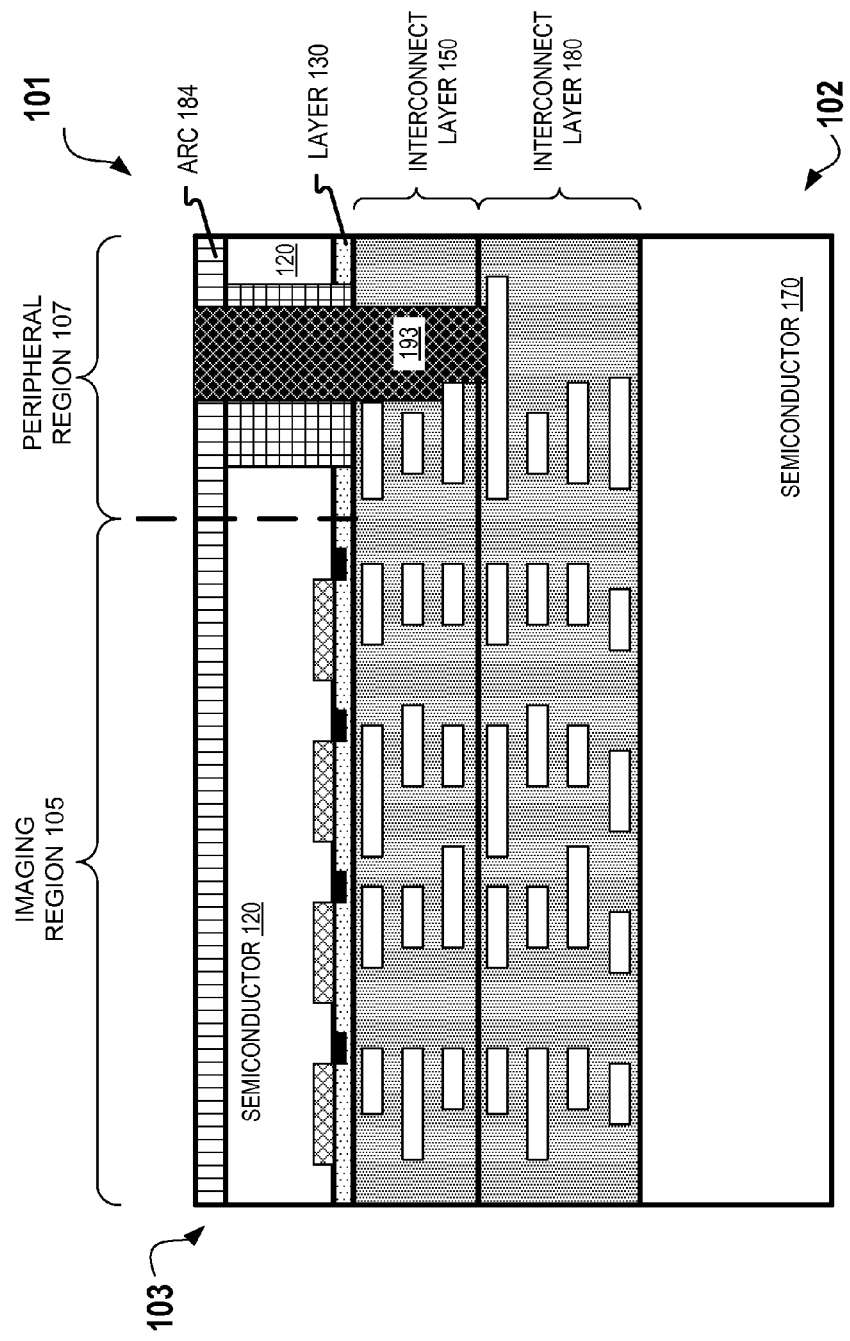

Via cavity 195 is filled with a conductive material, in FIG. 1K. Filling the via cavity 195 with conductive material (e.g. copper) forms a via 193 running from the top of wafer 101 to a metal layer 183 of interconnect layer 180 in wafer 102. The conductive material may be formed in via cavity 195 by an electrochemical plating ("ECP") process. Via 193 is insulated from semiconductor substrate 120 by insulating material 141.

Figure 3A:
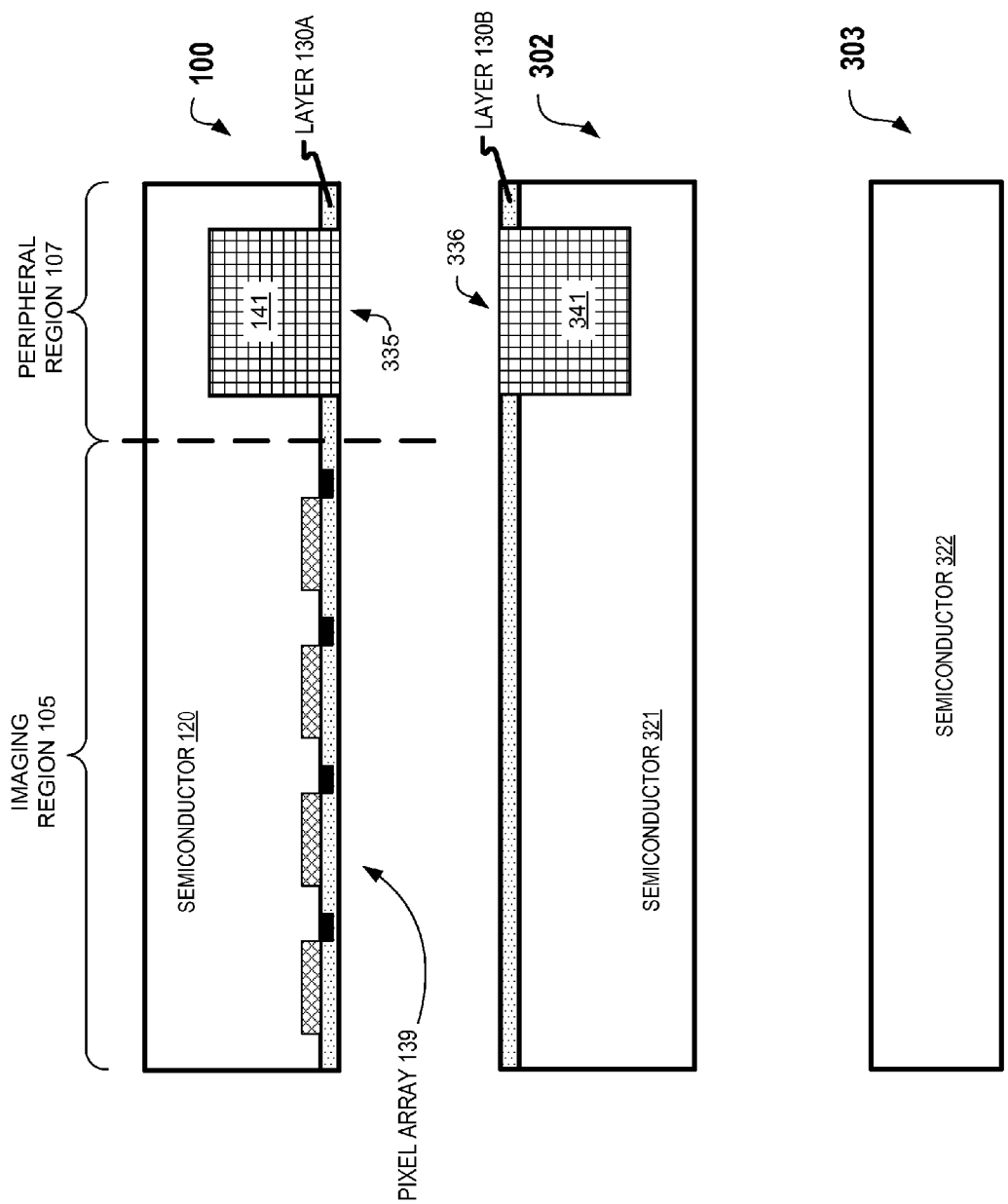
FIGS. 3A-3G illustrates a process of fabricating an image sensor having three or more wafers, in accordance with an embodiment of the disclosure.

FIG. 3A shows the wafer structure 100 that is illustrated in FIG. 1E, in accordance with embodiments of the disclosure. Wafer structure 100 may have been formed by the methods disclosed in association with FIGS. 1A-1E. Wafer structure 100 includes first semiconductor substrate 120, and an insulation-filled trench 335 in the peripheral region 107 of semiconductor substrate 120. Insulation-filled trench 335 is formed by filling a trench (e.g. trench 135) with an insulation filled material (e.g. insulation 141). Pixel array 139 is disposed in the imaging region 105 of semiconductor substrate 120.

FIG. 3A also includes wafer 302 and wafer 303. Wafer 302 includes semiconductor substrate 321. Insulation-filled trench 336 is formed in semiconductor substrate 321. Wafer 303 include semiconductor substrate 322, in FIG. 3A. Semiconductor substrates 321 and 322 may have the same properties as semiconductor substrate 120.

Figure 3B:
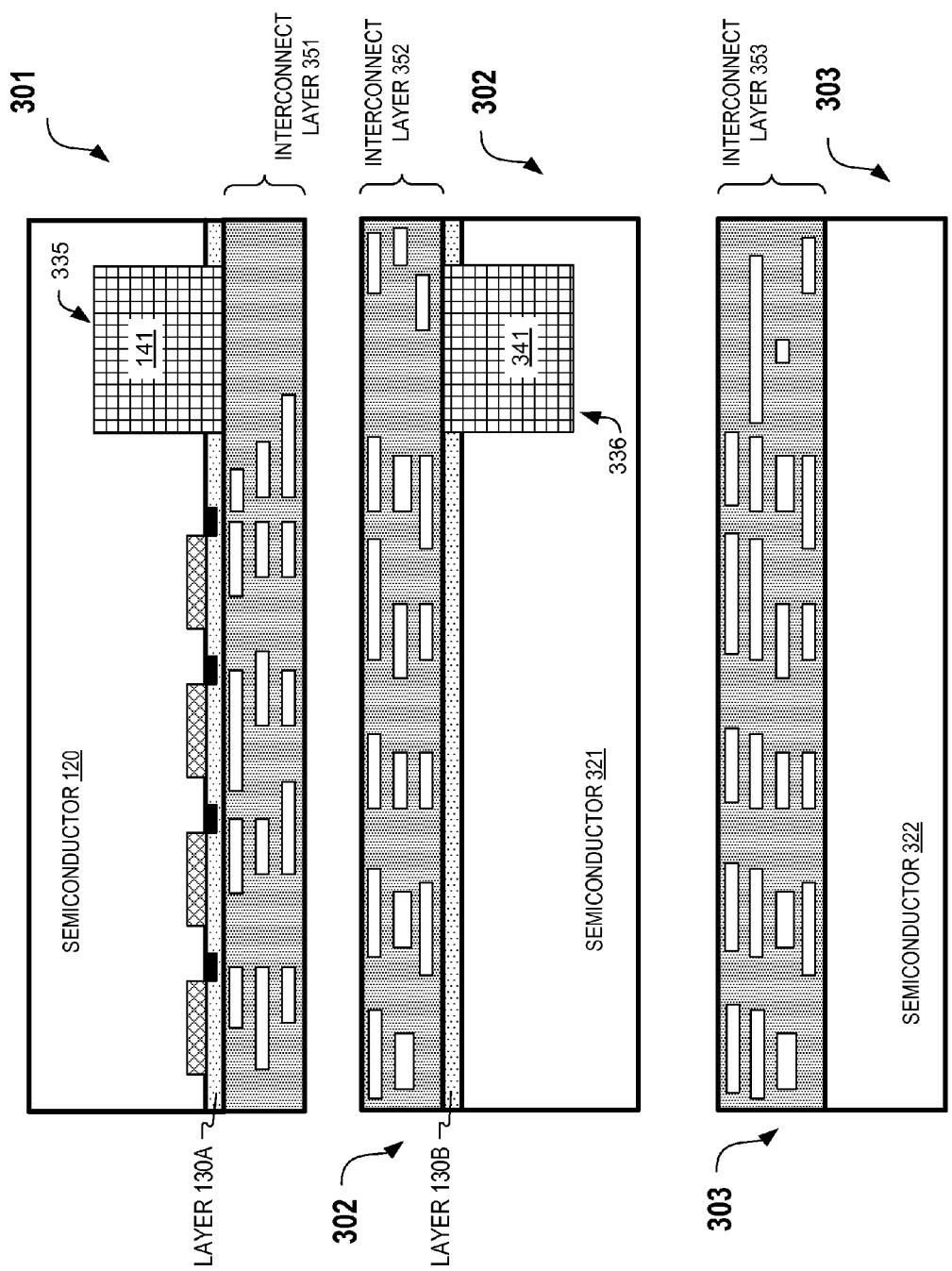

In FIG. 3B, a first interconnect layer 351 is formed on layer 130A, a second interconnect layer 352 is formed on layer 130B, and a third interconnect layer 353 is formed on semiconductor 322. First wafer 301 includes semiconductor substrate 120 and first interconnect layer 351, second wafer 302 includes semiconductor substrate 321 and second interconnect layer 352, and third wafer 303 includes semiconductor substrate 322 and third interconnect layer 353. The first, second, and third interconnect layers 351-353 include metal interconnect layers that are separated/insulated by dielectrics, similar to interconnect layers 150 and 180.

Figure 3C:
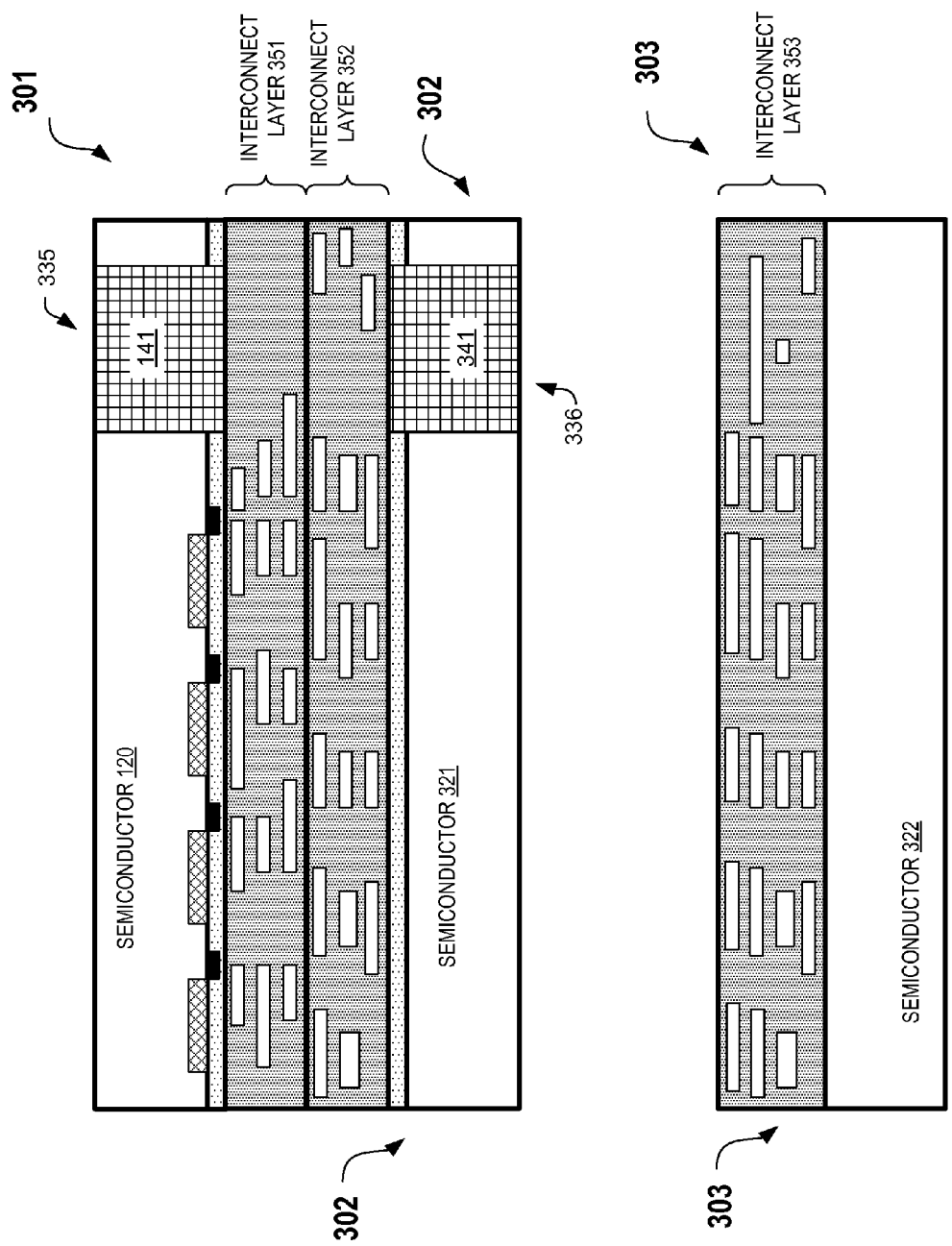

The first wafer 301 is bonded to the second wafer 302, in FIG. 3C. In the illustrated embodiment of FIG. 3C, first interconnect layer 351 is bonded to second interconnect layer 352 such that interconnect layer 351 and interconnect layer 352 are disposed between semiconductor substrates 120 and 321. FIG. 3C also shows that semiconductor substrate 120 and semiconductor substrate 321 have been thinned. Semiconductor substrate 120 and semiconductor substrate 321 may be thinned before first wafer 301 and second wafer 302 are bonded. Second insulation-filled trench 336 is disposed under first insulation-filled trench 335. In the illustrated embodiment of FIG. 3C, both sides of second insulation-filled trench 336 are aligned beneath both sides of first insulation-filled trench 335.

Figure 3D:
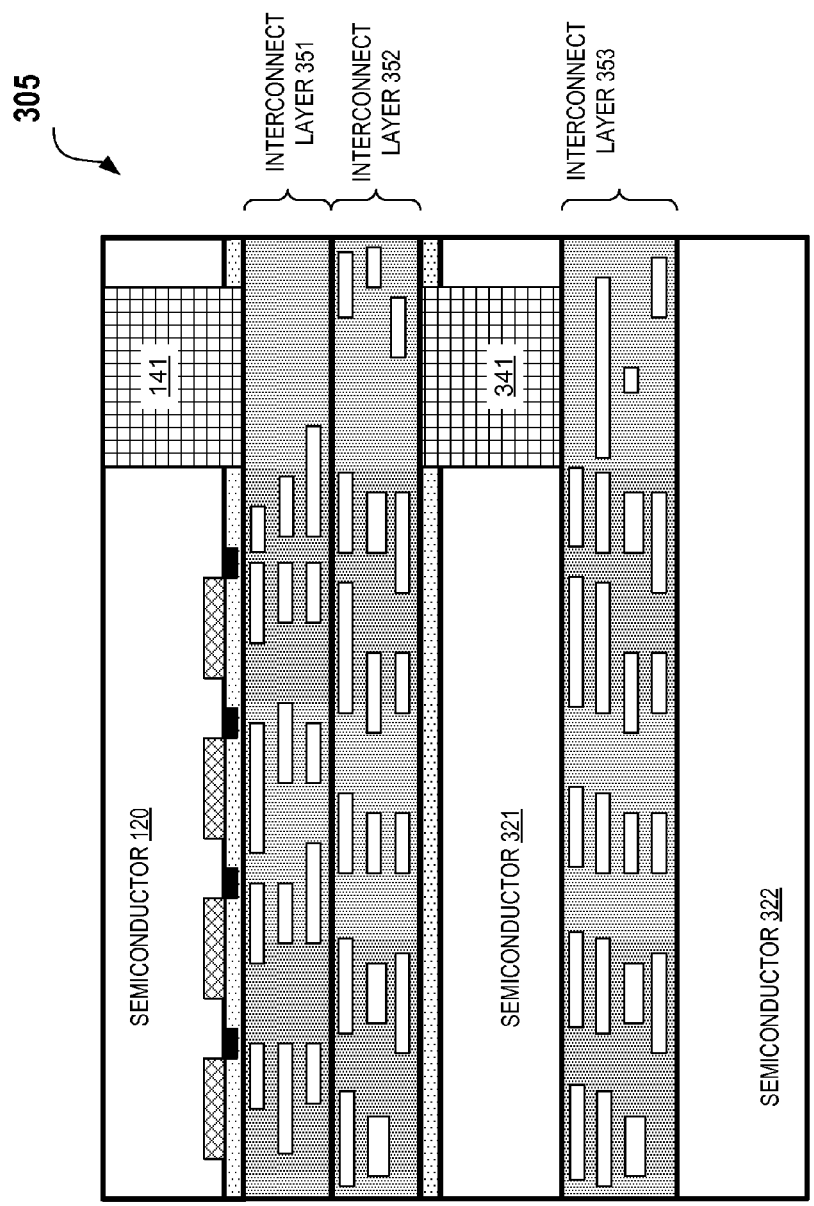

FIG. 3D illustrates multi-wafer imaging device 305. In FIG. 3D, third interconnect layer 353 has been bonded to second wafer 302. In the particular embodiment illustrated in FIG. 3D, third interconnect layer 353 is bonded to semiconductor substrate 321.

Figure 3E:
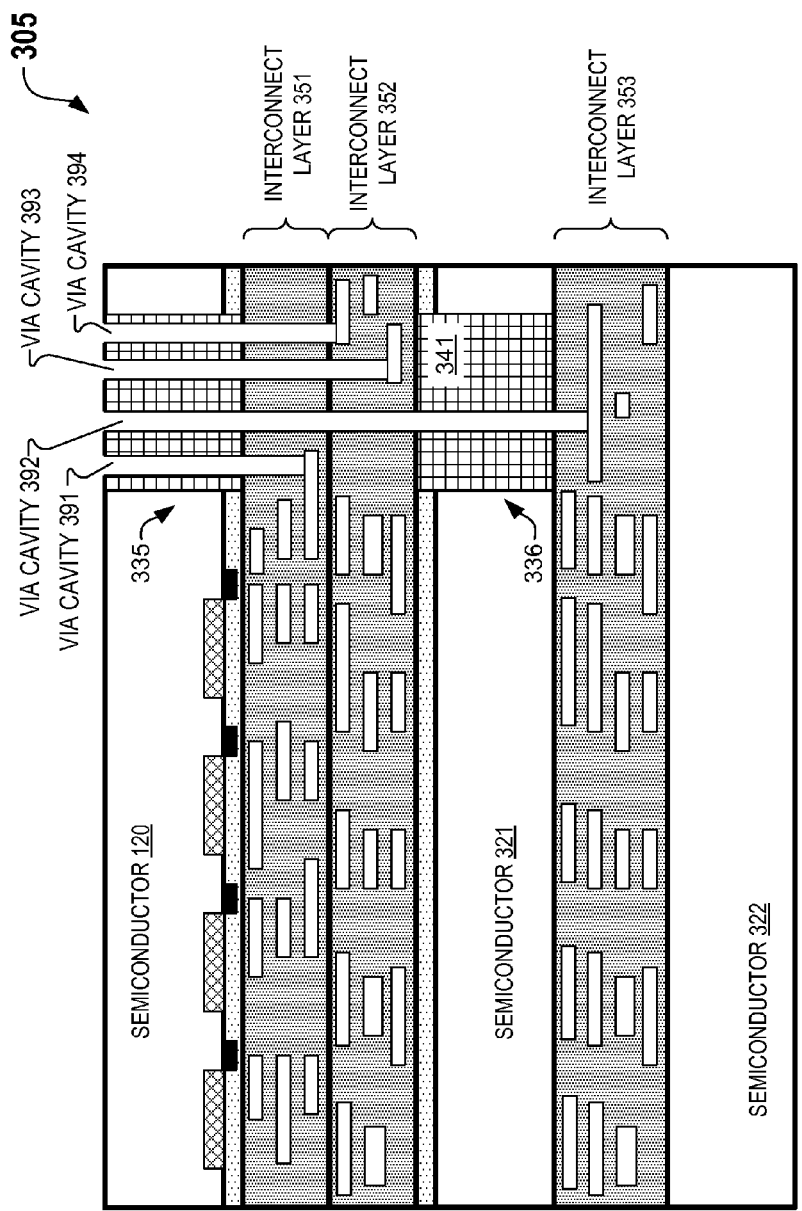

In FIG. 3E, via cavity 392 is formed through first interconnect layer 351, second interconnect layer 352, first insulation-filled trench 335, and second insulation-filled trench 336. Via cavity 392 also extends partially through interconnect layer 353 to meet a metal layer within interconnect layer 353. Although not illustrated, more than one via cavity may be formed through first interconnect layer 351, second interconnect layer 352, first insulation-filled trench 335, and second insulation-filled trench 336. Via cavity 391 is formed in the first insulation-filled trench 335 and extends to a metal layer inside interconnect layer 351. Via cavity 393 is formed through first insulation-filled trench 335 and interconnect layer 351 and extends to a metal layer inside interconnect layer 352. Via cavity 394 is formed through first insulation-filled trench 335 and interconnect layer 351 and extends to a metal layer inside interconnect layer 352. Via cavities 391-394 may be formed at the same time. Via cavities 391-394 may be formed using a patterned etch process. A patterned etch may depend on the metal layers to stop the etching of the respective via cavities.

Figure 3F:
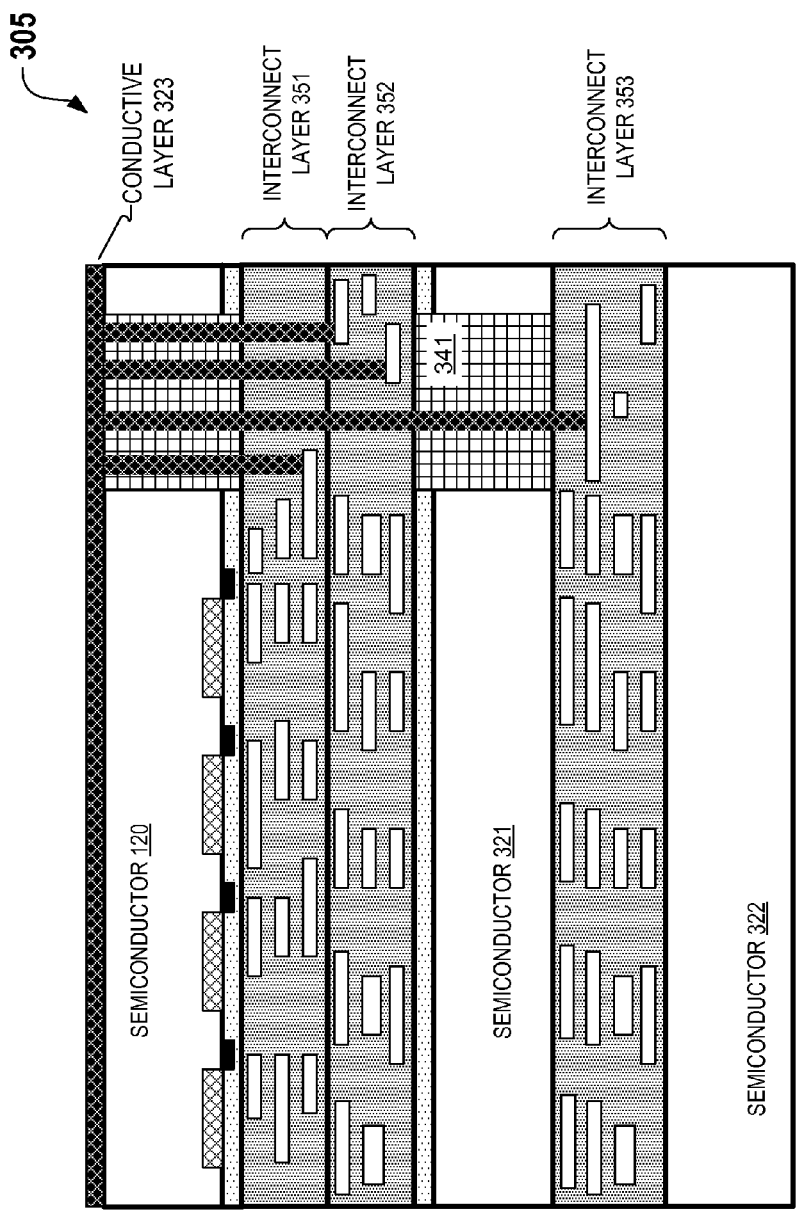

In FIG. 3F, via cavities 391-394 are filled with a conductive layer 323. An electrochemical plating process may fill the via cavities 391-394 with the conductive material.

Figure 3G:
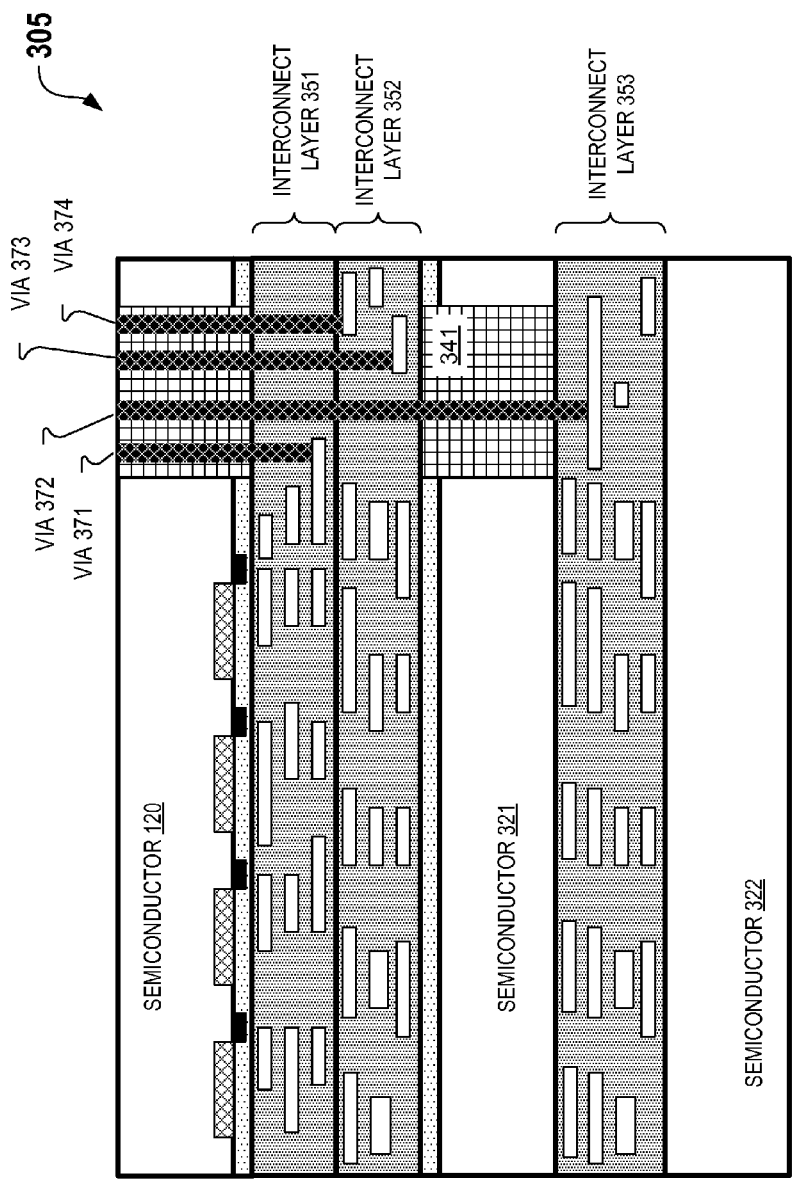

In FIG. 3G, excess conductive layer 323 is removed from multi-wafer imaging device 305. In one embodiment, the excess conductive layer 323 is removed using a planarization process such as CMP. After the excess conductive layer 323 is removed, vias 371-374 are left over. At least some of the vias 371-374 may be considered "deep vias." Further processing (not illustrated) may be completed to connect different vias. For example, if via 371 and 372 both carry the same signal, an additional metal layer may be formed to connect vias 371 and 372.

In the process illustrated in FIGS. 1A-1K, insulation material 141 is formed in trench 135 after pixel array 139 is formed in semiconductor substrate 120. In one embodiment, insulation material 141 is formed in trench 135 after the Front-End-of-Line ("FEOL") process is completed on wafer structure 100, but prior to a Back-End-of-Line ("BEOL") process. Then, via 193 is formed after bonding wafer 101 to wafer 102. Forming the insulation material in trench 135 between FEOL and BEOL allows via cavity 195 (and other via cavities) to be formed on a flat surface and without the need to add an oxide liner to via cavities after a silicon etch. Adding an insulating liner to via cavities uses up valuable real estate and may require further etching at the bottom of a via cavity to expose the metal layer at the bottom of the via cavity. Using the process described in FIGS. 1A-1K where via cavities are formed in insulation material 141 means that the via cavities are pre-insulated from semiconductor substrate 120 and thus don't require the additional process step of adding an insulating liner. Additionally, using a one-step subtractive process to form an insulated via cavity rather than a subtractive process (etching silicon) followed by an additive process (lining each via cavity with an insulator) allows smaller vias to be formed, which increases the density of signals that can be run through periphery region 107.

Similar to the process illustrated in FIGS. 1A-1K, in the process illustrated in FIGS. 3A-3G, insulation-filled trench 335 is formed after pixel array 139 is formed in semiconductor substrate 120 and insulation-filled trench 336 is formed after CMOS fabrication of devices within semiconductor substrate 321. In one embodiment, insulation-filled trenches 335 and 336 are formed after the Front-End-of-Line ("FEOL") process is completed on their respective wafers, but prior to a Back-End-of-Line ("BEOL") process on their respective wafers. Then, vias 371-374 are formed after bonding wafers 301, 302, and 303. Forming insulation-filled trenches 335 and 336 between FEOL and BEOL and then forming via cavities 391-394 in the insulation-filled trenches after bonding of the wafers 301-303 offers similar advantages as described in association with the process illustrated in FIGS. 1A-1K.

Figure 4:
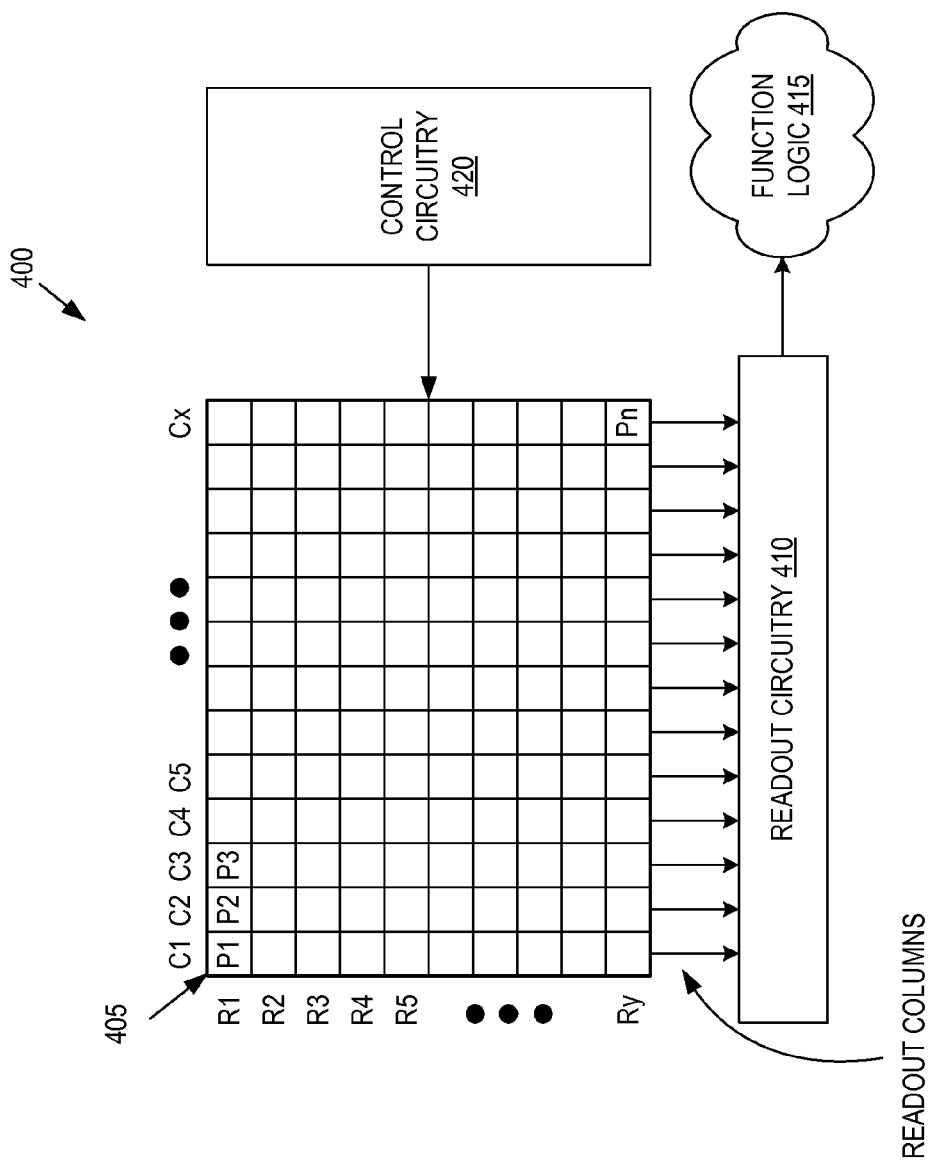
FIG. 4 is a functional block diagram illustrating an imaging sensor, in accordance with an embodiment of the disclosure.

FIG. 4 is a functional block diagram illustrating an imaging sensor 400, in accordance with an embodiment of the disclosure. The illustrated embodiment of imaging sensor 400 includes pixel array 405, readout circuitry 410, function logic 415, and control circuitry 420. Pixel array 405 may be utilized as pixel array 139. Readout circuitry 410, function logic 415, and control circuitry 420 may be disposed in semiconductor substrate 170 or disposed in peripheral region 107 of semiconductor substrate 120. Readout circuitry 410, function logic 415, and control circuitry 420 may also be disposed in semiconductor substrate 321 or 322.

Pixel array 405 is a two-dimensional ("2D") array of imaging sensors or pixels (e.g., pixels P1, P2 . . . , Pn). In one embodiment, each pixel is a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is read out by readout circuitry 410 and transferred to function logic 415. Readout circuitry 410 may include amplification circuitry, analog-to-digital ("ADC") conversion circuitry, or otherwise. Function logic 415 may simply store the image data or even manipulate the image data by applying post image effects (e.g., crop, rotate, remove red eye, adjust brightness, adjust contrast, or otherwise). In one embodiment, readout circuitry 410 may readout a row of image data at a time along readout column lines (illustrated) or may readout the image data using a variety of other techniques (not illustrated), such as a serial readout or a full parallel readout of all pixels simultaneously. Control circuitry 420 is coupled to pixel array 405 to control operational characteristic of pixel array 405. For example, control circuitry 420 may generate a shutter signal for controlling image acquisition.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method of fabricating an image system, the method comprising:
    forming a pixel array in an imaging region of a semiconductor substrate;
    forming a trench in a peripheral region of the semiconductor substrate after forming the pixel array, wherein the peripheral region is on a perimeter of the imaging region;
    filling the trench with an insulating material;
    forming an interconnect layer spanning the imaging region and the peripheral region after filling the trench with the insulating material, wherein a first wafer includes the interconnect layer and the semiconductor substrate, and wherein the insulating material is planarized prior to forming the interconnect layer;
    bonding the first wafer to a second wafer;
    thinning a backside of the semiconductor substrate to expose the insulating material;
    forming a via cavity through the insulating material, wherein the via cavity extends down to a second interconnect layer of the second wafer; and
    filling the via cavity with a conductive material to form a via, wherein the insulating material electrically insulates the conductive material from the semiconductor substrate.

2. The method of claim 1, wherein the insulating material includes an oxide.

3. The method of claim 1 further comprising:
forming an anti-reflection insulation layer on the backside of the semiconductor substrate, wherein the anti-reflection insulation layer is formed after thinning the backside of the semiconductor substrate and prior to forming the via cavity.

4. The method of claim 1, wherein a trench depth of the trench is deeper than photodiodes of the pixel array.

5. The method of claim 1 further comprising:
forming an insulating layer over the peripheral region and transfer gates of pixels in the pixel array, wherein the insulating layer is formed prior to forming the trench.

6. The method of claim 5, wherein the trench extends through the insulating layer.

7. The method of claim 1, wherein the interconnect layer of the first wafer and the second interconnect layer of the second wafer are bonded together.

8. The method of claim 1, wherein the second wafer includes a second semiconductor substrate that includes processing circuitry to process image data from the pixel array.

9. The method of claim 1, wherein forming the via trench includes etching through the insulating material and dielectric of the interconnect layer.

* * * * *